(12) United States Patent
Chen et al.

(10) Patent No.: US 8,921,128 B2
(45) Date of Patent: Dec. 30, 2014

(54) METHOD OF MANUFACTURING MEMS DEVICES WITH RELIABLE HERMETIC SEAL

(71) Applicant: Analog Devices, Inc., Norwood, MA (US)

(72) Inventors: Li Chen, Belmont, MA (US); Kuang L. Yang, Newton, MA (US)

(73) Assignee: Analog Devices, Inc., Norwood, MA (US)

(*) Notice: Subject to any disclaimer, the term of this patent is extended or adjusted under 35 U.S.C. 154(b) by 57 days.

(21) Appl. No.: 13/904,681

(22) Filed: May 29, 2013

(65) Prior Publication Data

US 2014/0356989 A1 Dec. 4, 2014

(51) Int. Cl.
*B81C 1/00* (2006.01)
*H01L 21/66* (2006.01)

(52) U.S. Cl.
CPC ............ *B81C 1/00341* (2013.01); *H01L 22/14* (2013.01)
USPC .................. 438/15; 438/14; 73/40.7; 73/49.3

(58) Field of Classification Search
CPC ...... G10M 3/186; G10M 3/329; G10M 3/226
USPC ................. 438/14, 15; 73/40.7, 49.3
See application file for complete search history.

(56) References Cited

U.S. PATENT DOCUMENTS

| 7,601,537 | B2 * | 10/2009 | Gueissaz et al. .................. 436/3 |
| 7,739,900 | B2 | 6/2010 | Reinert et al. .................. 73/40.7 |
| 7,892,839 | B2 * | 2/2011 | Gueissaz et al. .................. 436/3 |
| 8,267,486 | B2 * | 9/2012 | Sammoura et al. ...... 303/122.05 |
| 2006/0065043 | A1 * | 3/2006 | Cummings .................. 73/40.7 |
| 2007/0196923 | A1 * | 8/2007 | Gueissaz et al. .................. 436/3 |
| 2007/0196943 | A1 * | 8/2007 | Kumst ........................ 438/48 |
| 2008/0066524 | A1 * | 3/2008 | Cummings .................. 73/40.7 |

OTHER PUBLICATIONS

Elger et al., "Optical Leak Detection for Wafer Level Hermeticity Testing," IEEE/SEMI Int'l Electronics Manufacturing Technology Symposium, 6 pages, 2004.
Li et al., "Assessment of testing methodologies for thin-film vacuum MEMS packages," Microsyst Technol, vol. 15, pp. 161-168, 2009.

* cited by examiner

*Primary Examiner* — Alexander Ghyka
(74) *Attorney, Agent, or Firm* — Sunstein Kann Murphy & Timbers LLP

(57) ABSTRACT

Manufactured capped MEMS device wafers are tested for hermeticity on a vacuum prober at differing pressures or on a wafer prober at differing temperatures. Resonant frequency testing is conducted. Leaking MEMS devices are distinguished from the remaining MEMS devices on the basis of quality factor ("Q") measurements obtained from the resonant frequency testing.

19 Claims, 4 Drawing Sheets

METHOD OF MANUFACTURING MEMS DEVICES WITH RELIABLE HERMETIC SEAL

TECHNICAL FIELD

The present invention relates to manufacture of MEMS devices, and more particularly to hermeticity testing to produce MEMS devices with reliable seals.

BACKGROUND ART

It is known in the prior art to manufacture MEMS devices. In particular, devices such as accelerometers and gyro sensors are made with a hermetically sealed chamber in which the movable MEMS member is disposed. The hermetic seal protects the MEMS device from the environment. For example, the hermetic seal may protect the device from dust, moisture and dirt. Moreover, changes in air pressure within the MEMS chamber will cause changes in the sensitivity of the MEMS sensor.

Economical manufacture of mass quantities of MEMS devices generally involves simultaneously forming multiple MEMS devices on a semiconductor wafer. When there is a need for a hermetic seal, a manufacturer charged with producing such MEMS devices needs to be able to test each device to assure that a reliable seal has been formed during the processing. Resonant frequency testing determines for each device a measure of the resonant frequency and a measure of quality factor (Q). U.S. Pat. No. 7,739,900 (Reinert et al.) describes bombing vacuum bonded MEMS devices being tested with a high pressure of 1.5 to 5 bars for a period of 10 to 100 hours. Q factor measurements are used to determine which devices are leaky.

For devices capped to maintain the pressures in their chambers significantly away from one atmosphere, resonant frequency testing at atmospheric pressure can detect the leaky devices. For devices bonded in a vacuum, the hermetically sealed devices will exhibit a Q factor above that of devices that leak. Differences can be recognized because of the sensitivity of Q factor to changes in pressure at the low pressures inside the MEMS chambers. To make the test sensitive enough to readily distinguish leaky devices from hermetically sealed devices, the pressure within the chamber of the hermetically sealed devices should be as far below 1 atmosphere as possible.

SUMMARY OF THE EMBODIMENTS

In accordance with a first embodiment, MEMS devices are manufactured on a wafer. The wafer having a plurality of capped MEMS devices formed thereon is inserted into a vacuum prober. Ambient pressure within the vacuum prober is reduced to a pressure below that in the chamber of a MEMS device on the wafer. In a preferred embodiment, the pressure is reduced below 200 mbar. Resonant frequency testing of the MEMS devices is conducted while the wafer is in the vacuum prober at the reduced ambient pressure. Based upon Q factor measurements obtained from the resonant frequency testing, leaking MEMS devices are distinguished from the remaining MEMS devices. The leaking MEMS devices are identified as those exhibiting a high Q during the testing relative to the Q of the remaining MEMS devices.

Manufacture of the devices continues with singulating the wafer into individual MEMS devices. The leaking MEMS devices may then be physically separated from the remaining devices. The remaining devices may proceed to packing for shipment.

In a second embodiment of the invention, the wafer of capped MEMS devices is placed onto a wafer prober. Resonant frequency testing is conducted at a first temperature. The wafer is then brought to a second temperature on the wafer prober. Resonant frequency testing is conducted at the second temperature on the wafer prober. Based upon Q factor measurements obtained from the resonant frequency testing at the first temperature and at the second temperature, leaking MEMS devices are distinguished from the remaining MEMS devices. The leaking MEMS devices are identified as those exhibiting a little or no change in Q between the resonant frequency testing at a first temperature and the resonant frequency testing at a second temperature relative to the change in Q exhibited by the remaining MEMS devices.

As in the previous embodiment, manufacture of the devices continues with singulating the wafer into individual MEMS devices. The leaking MEMS devices may then be physically separated from the remaining devices. The remaining devices may proceed to packing for shipment.

The manufacturing methods of the invention are of particular value when the MEMS devices are capped with ASICs, or more specifically CMOS ICs.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Definitions

As used in this description and the accompanying claims, the following terms shall have the meanings indicated, unless the context otherwise requires:

Resonant frequency testing is a test method in which electrical signals over a range of frequencies is applied to a device.

Figure 1:
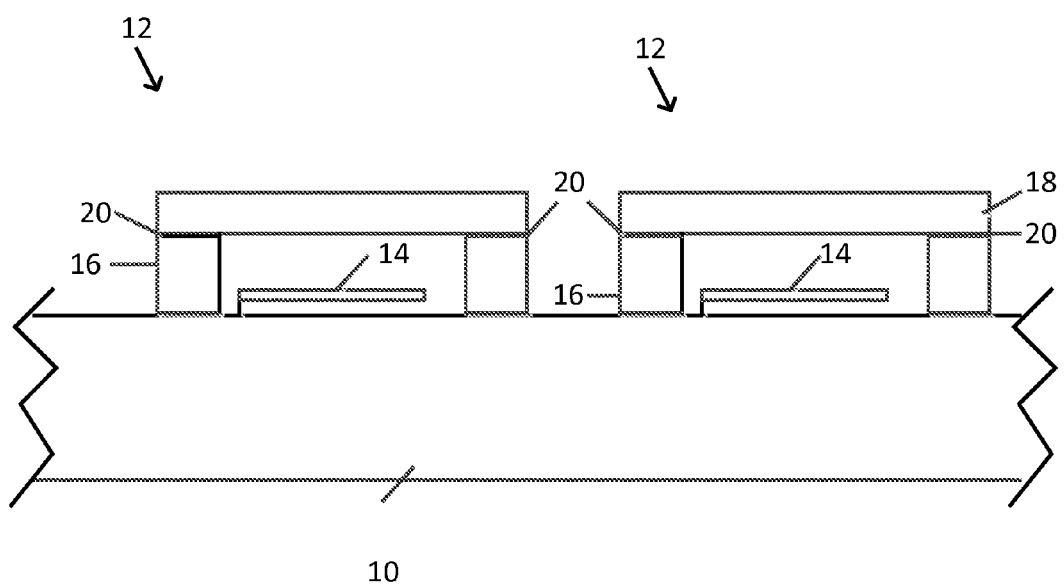
FIG. 1 is a schematic cutaway side view of two MEMS devices on a wafer being manufactured in accordance with methods of the present invention.

FIG. 1 shows a semiconductor wafer 10 with a plurality of capped MEMS devices 12 formed thereon. As is known in the art, movable structures 14 are formed in the wafer through a series of deposition and removal processes. The movable structures may move in one or more directions as required by the particular MEMS device being manufactured. Particular MEMS devices suitable for manufacture with the methods described herein include accelerometers and gyro sensors. Sidewalls 16 surrounding each movable structure 14 may also be formed in the wafer 10. The sidewalls 16 support a cap 18 above the MEMS structure. The cap 18, sidewalls 16 and wafer 10 form an enclosed chamber in which the movable structure 14 is disposed. Instead of individually placing caps 18 on each of the MEMS devices, the caps may be manufactured by placing a cap wafer over the device wafer 10. A bonding layer 20 is situated on top of the sidewalls 16. Any of a variety of bonding materials may be used to achieve a hermetic seal. In a particular embodiment, the bonding may be performed by AlGe eutectic bonding. In other embodiments, the bonding material may be AlCu, for example.

In order to eliminate the need for space otherwise occupied by a separate silicon circuit chip in an end product package, the MEMS device can be constructed with an ASIC used as the cap 18. Electrical connections between the ASIC and the MEMS die can be fabricated within the bonding layer 20 between the cap and the die. The bond metal layer may be patterned to include both a hermetic seal ring and individual signal nodes. The individual nodes or metal pads are electrically isolated from the metal seal ring by etched silicon trenches. Each metal node on the cap layer is bonded to a corresponding node or pad on the MEMS die. The wafer bonding simultaneously forms the hermetic seal and the electrical connections. The electrical connections are isolated islands distributed within the bonding material forming the seal ring. Signals may then be passed between the MEMS and the ASIC.

A cap wafer for providing an array of ASICs may be a CMOS wafer. CMOS typically includes thin film materials, including low temperature deposited oxide and nitride layers, that outgas. Typically, hydrogen trapped in the layers escapes during or after the wafer bonding process conducted under heated conditions. This outgassing into the chamber of the MEMS device raises the internal pressure. With a typical semiconductor dumb cap, a vacuum bonded MEMS can maintain a very low internal pressure. As such, resonant frequency testing can be used to distinguish the sealed low pressure MEMS from the leaking MEMS whose internal pressures have significantly risen. At the higher internal pressures characteristic of CMOS capped MEMS devices, it becomes too difficult to distinguish the leaking devices from the sealed devices using resonant frequency testing in a conventional ambient environment. The testing methods taught herein overcome these difficulties.

In accordance with a first embodiment, testing is conducted in a vacuum prober. Vacuum probers are well known. For example, Cascade Microtech of Beaverton, Oreg. makes a number of vacuum probe systems that may be used to test wafers. There are numerous manufacturing sequences for producing capped device wafers suitable for hermeticity testing. Presented herein is one example of a series of steps for making the capped device wafers.

A MEMS device wafer 10 is formed with an array of MEMS device structures on the wafer. The manufacture of the device wafer 10 typically includes a number of vapor deposition steps and etching steps. A cap wafer is bonded 30 to the MEMS device wafer. Bonding typically involves application of pressure and heat to the wafers to achieve a secure bond creating a hermetic seal under controlled conditions. In particular embodiments, the cap wafer is a CMOS wafer having an array of ASICs formed thereon. The array of ASICs must be properly aligned with the underlying array of MEMS device structures, so that each individual MEMS device will include a MEMS structure underneath an ASIC.

Often, a thin profile is desired for the semiconductor devices so that they require less space in an ultimate end product. Therefore, a thinning process 40 such as backgrinding or chemical etch process is used to reduce the thickness of the cap wafer. Moreover, electrical vias in the cap wafer may need to be externally exposed. Advantageously, the thinning process 40, whether with backgrinding or etching, exposes vias at the top of the cap. The capped MEMS wafer may then receive and respond to electrical signals applied by probes to specified bond pads on top of the capped devices. The capped device wafer is then ready for hermeticity testing. But if desired, the cap wafer may, optionally, be first diced into individual caps 18 while leaving the MEMS wafer intact. The MEMS wafer is left intact, but the cap wafer is cut into individual caps 18. Whether or not the cap wafer is diced, the wafer with its capped MEMS devices can be placed in a prober for testing.

Figure 2:
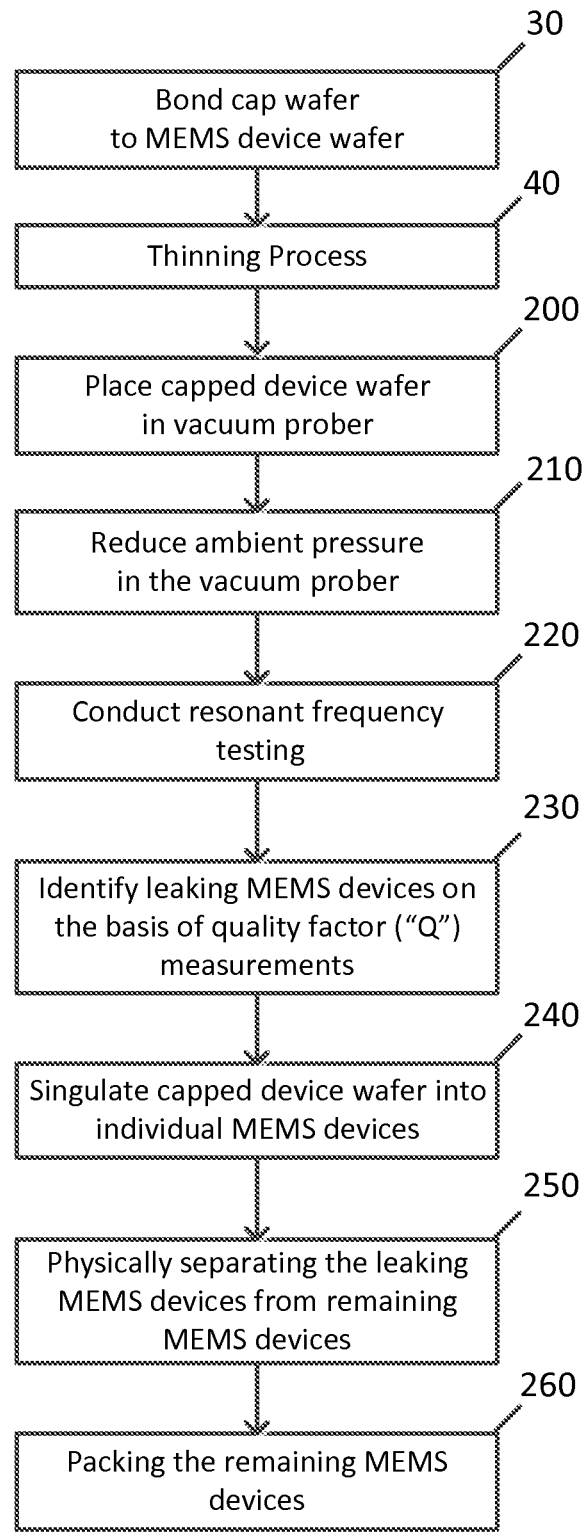
FIG. 2 is a flow chart of a method of making MEMS devices in accordance with a first embodiment of the present invention.

In accordance with the first embodiment illustrated in FIG. 2, the capped device wafer is placed 200 in the vacuum prober. The ambient pressure within the vacuum prober is reduced 210 to below a pressure within a chamber of at least one of the capped MEMS devices. Preferably, the pressure is reduced below the pressures found within any and all of the MEMS devices. With an ASIC cap, outgassing from the cap may cause pressure in the chambers of the MEMS devices to rise to within a range of from 500 mbar to near one atmosphere, i.e., 1000 mbar. Therefore, in particular embodiments, pressure within the vacuum prober would be reduced 210 to within the range of 100-200 mbar.

Resonant frequency testing 220 is conducted on each of the MEMS devices while the wafer is in the vacuum prober at the reduced ambient pressure. This involves a sine wave signal (AC signal) applied to the MEMS movable structure and its corresponding fixed electrode in the capacitor model. The AC signal excites the beam to resonate with respect to the fixed electrode. The frequency of the AC signal can be swept from low to high (based on each design target, i.e., for sensor designed at 4.5 KHz, we can sweep from 100 Hz to 8000 Hz). Output amplitudes for input frequency signals in a range extending across the resonant frequency are measured. When the excitation frequency reaches around the real resonating frequency the corresponding signal amplitude will be significantly higher. The resonant frequency testing will, thus, identify a resonant frequency for each MEMS device. A peak will be evident at the resonant frequency in the amplitude vs. frequency plot. A bandwidth is identified by the span of frequencies within which amplitude is reduced by less than 3 dB from the maximum amplitude at the resonant frequency. A quality factor "Q" corresponds to the amplitude at the resonant frequency divided by the frequency bandwidth. The sharper the peak, the higher the Q. Leaking MEMS devices are identified 230 based upon the quality factor ("Q") measurements resulting from the resonant frequency testing. A MEMS device having an enclosed chamber, such as an accelerometer or a gyro sensor, will exhibit a Q that is inversely related to pressure. The change in Q relative to pressure is pronounced below one atmosphere and becomes even more pronounced at very low pressures. Thus, a MEMS device that is leaking into vacuum chamber will exhibit a markedly higher Q than a hermetically sealed device. The Q test thereby effectively distinguishes the leaking MEMS devices from the remaining MEMS devices.

The prober system generates a wafer probe map corresponding to the array of devices on the wafer. The system considers the actual die sizes and die pitch to create a map that matches the layout of devices on the wafer. Probing typically begins with a reference device in the array, such as the top left device. The prober system electronically records the test results for each device and assigns a destination bin for each. For example, passing devices may be destined for a bin to be filled with hermetically sealed devices and failing devices may be destined for a trash bin.

Figure 4:
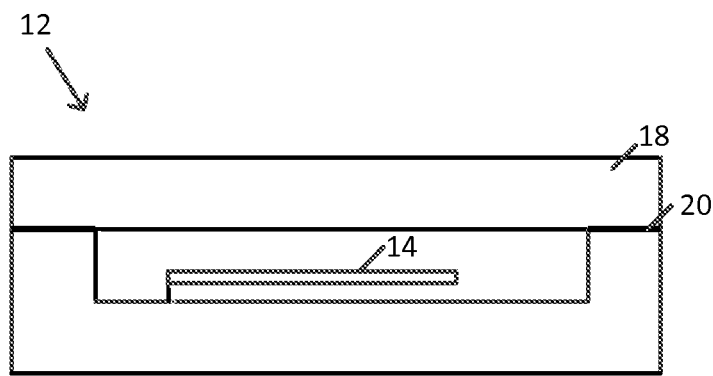
FIG. 4 is a schematic cutaway side view of a MEMS device made according to any of the methods of the present invention.

After identifying the leaking MEMS devices on the capped wafer, the wafer is singulated 240 into individual MEMS devices. An individual MEMS device is illustrated in FIG. 4. The leaking MEMS devices may then be physically separated 250 from the remaining MEMS devices. A pick and place machine, or other suitable machine, may be used to read the wafer probe map and accordingly remove the leaking MEMS devices from the production line. The remaining MEMS devices are ready for packing 260. This may be as simple as packing the individual MEMS devices for shipping. As such, the devices would be picked and placed into a shipping format, like a Tape and Reel. In other embodiments, packing may further involve inserting the device along with other components into a plastic package to create a more comprehensive electronic component. The packages are packed for shipping. Manufacture in accordance with the steps explained above produces MEMS devices with a high degree of reliability.

Figure 3:
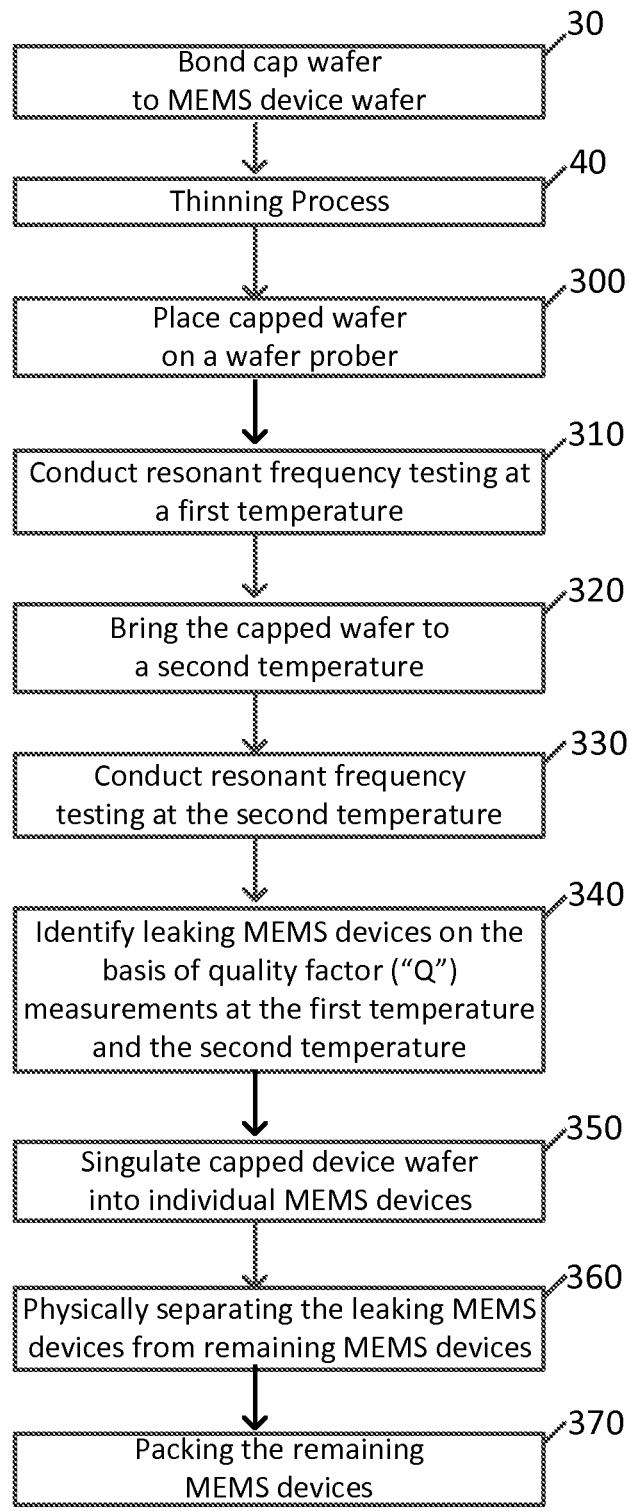
FIG. 3 is a flow chart of a method of making MEMS devices in accordance with a second embodiment of the present invention.

In accordance with a second embodiment as shown in FIG. 3, the manufacture of the capped MEMS device wafer proceeds as explained above for the first embodiment. A vacuum is not required in this embodiment. Instead, the capped device wafer is placed 300 on a wafer prober, without regard to ambient pressure. Atmospheric pressure is acceptable. Resonant frequency testing 310 is conducted with the capped device wafer at a first temperature. The resonant frequency and Q factor are determined for each of the tested MEMS devices. The capped wafer is brought 320 to a second temperature, different enough from the first temperature to produce a change in Q factor. For example, the wafer prober could heat the wafer to a temperature of 85° C. or 125° C. On the other hand, the temperature difference can be achieved by using a cryogenic cooling system to cool the wafer prober. The wafer could be cooled to a temperature of −40° C., for example.

Resonant frequency testing is conducted 330 on each of the MEMS devices while the wafer is at the second temperature on the wafer prober. Resonant frequency and Q factor are determined once again for each MEMS device. For hermetically sealed MEMS devices, the Q factors will change in response to the change in temperature. The pressure inside the sealed enclosure will change with change in temperature thereby affecting the damping of the moveable MEMS structure. For a leaking MEMS device, the will remain relatively unchanged as the leak allows the pressure within the device to equalize with ambient pressure. Therefore the hermetically sealed MEMS devices will exhibit a noticeably larger change in Q between the two resonant frequency tests as compared with the leaking MEMS devices. In this way, based upon any change in quality factor ("Q") between the resonant frequency testing at the first temperature and the resonant frequency testing at the second temperature, the leaking MEMS devices are distinguished 340 from the remaining MEMS devices.

As explained above for the first embodiment, once the leaking MEMS devices have been identified, the capped device wafer can be singulated 350 into individual MEMS devices, such as is shown in FIG. 4. The leaking MEMS devices are physically separated 360 from the remaining MEMS devices. The remaining MEMS devices are packed 370 for shipping.

The embodiments described above have the advantage of working to distinguish sealed MEMS devices from leaking MEMS devices, even when the chambers of those devices are normally above 500 mbar. Therefore, a MEMS device having a cap that is an ASIC, particularly one that is a CMOS cap, can be reliably manufactured and leaking devices separated out using the above-described methods.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of manufacturing MEMS devices with a reliable seal comprising:
   inserting at least one wafer with a plurality of capped MEMS devices formed thereon into a vacuum prober;
   reducing ambient pressure in the vacuum prober below a pressure within a chamber of at least one of the capped MEMS devices;
   conducting resonant frequency testing of each of the MEMS devices while the at least one wafer is in the vacuum prober at the reduced ambient pressure;
   distinguishing leaking MEMS devices from the remaining MEMS devices based upon quality factor ("Q") measurements obtained from the resonant frequency testing.

2. The method of claim 1 wherein distinguishing comprises identifying leaking MEMS devices as those exhibiting a high Q in the resonant frequency testing relative to the remaining MEMS devices.

3. The method of claim 1 further comprising singulating the at least one wafer into individual MEMS devices.

4. The method of claim 3 further comprising physically separating the leaking MEMS devices from the remaining MEMS devices.

5. The method of claim 3 further comprising packing any of the remaining MEMS devices for shipment.

6. The method of claim 1 wherein the MEMS devices comprise accelerometers.

7. The method of claim 1 wherein the MEMS devices comprise gyro sensors.

8. The method of claim 1 wherein reducing ambient pressure comprises reducing ambient pressure within the vacuum prober to below 200 mbar.

9. The method of claim 1 wherein each of the capped MEMS devices is capped with an ASIC.

10. The method of claim 1 wherein each of the capped MEMS devices is capped with a CMOS IC.

11. A method of manufacturing MEMS devices with a reliable seal comprising:
    placing at least one wafer with a plurality of capped MEMS devices formed thereon onto a wafer prober;
    conducting resonant frequency testing of each of the MEMS devices while the at least one wafer is at a first temperature on the wafer prober;
    bringing the at least one wafer to a second temperature on the wafer prober;
    conducting resonant frequency testing of each of the MEMS devices while the at least one wafer is at the second temperature on the wafer prober;
    distinguishing leaking MEMS devices from the remaining MEMS devices based upon quality factor ("Q") obtained from the resonant frequency testing at the first temperature and at the second temperature.

12. The method of claim 11 wherein distinguishing comprises identifying leaking MEMS devices as those exhibiting a little or no change in Q between the resonant frequency testing at a first temperature and the resonant frequency testing at a second temperature relative to the change in Q exhibited by the remaining MEMS devices.

13. The method of claim 11 further comprising singulating the at least one wafer into individual MEMS devices.

14. The method of claim 13 further comprising physically separating the leaking MEMS devices from the remaining MEMS devices.

15. The method of claim 13 further comprising packing any of the remaining MEMS devices for shipment.

16. The method of claim 11 wherein the MEMS devices comprise accelerometers.

17. The method of claim 11 wherein the MEMS devices comprise gyro sensors.

18. The method of claim 11 wherein each of the capped MEMS devices is capped with an ASIC.

19. The method of claim 11 wherein each of the capped MEMS devices is capped with a CMOS IC.

* * * * *